POWER TRANSISTOR AMPLIFIER HAVING CURRENT BALANCING MEANS

Filed May 21, 1959 2 Sheets-Sheet 1

United States Patent Office 3,174,053
Patented Mar. 16, 1965

3,174,053
POWER TRANSISTOR AMPLIFIER HAVING CURRENT BALANCING MEANS

John S. Contino, South Acton, Mass., assignor to The Warren Manufacturing Company, Inc., Littleton, Mass., a corporation of Massachusetts Filed May 21, 1959, Ser. No. 814,739
7 Claims. (Cl. 307—88.5)

My invention relates to amplifying power-transistor devices for supplying a power output beyond the current-carrying capacity of an indiviual transistor circuit so that two or more transistors must be used in parallel for jointly meeting the demand. In a more particular aspect, my invention relates to inverters which comprise parallel-connected bridge networks of power transistors operating in the switching mode upon a power output transformer for translating a direct-current voltage into a square-wave alternating voltage.

In such devices, overloading of an individual transistor and danger of damage will occur if the paralleled power transistors do not properly or equally share the load; and in the event of resulting burn-out of an individual transistor, the excessive loading then imposed upon the transistors in the parallel paths may cause burn-out of other transistors. For instance, in paralleled bridge networks of switching transistors, burn-out of a transistor in one bridge may also destroy a transistor in each parallel bridge.

Relating to systems of paralleled power transistors of the above-mentioned kind, it is an object of my invention to make such systems inherently capable of enforcing positive load-sharing by the paralleled transistors without requiring additional protective or load-distribution controlling accessory devices as heretofore needed, and without impairing the performance of the transistors.

Another object is to obtain the desired load sharing of paralleled transistors without requiring these transistors to be carefully matched.

According to a feature of my invention, I provide the power output transformer of the transistor system with as many mutually insulated and inductively interlinked primary windings as there are parallel transistor circuits or bridge networks, and I connect the output leads of each parallel path or network with one of the respective primary windings as will more fully appear hereinafter. According to another, more specific feature, the primary windings of the power output transformer, all poled in the same sense, have all the same number of turns and the same resistance, this resistance being greater than the saturation resistance of the paralleled transistor amplifiers.

Figure 1:
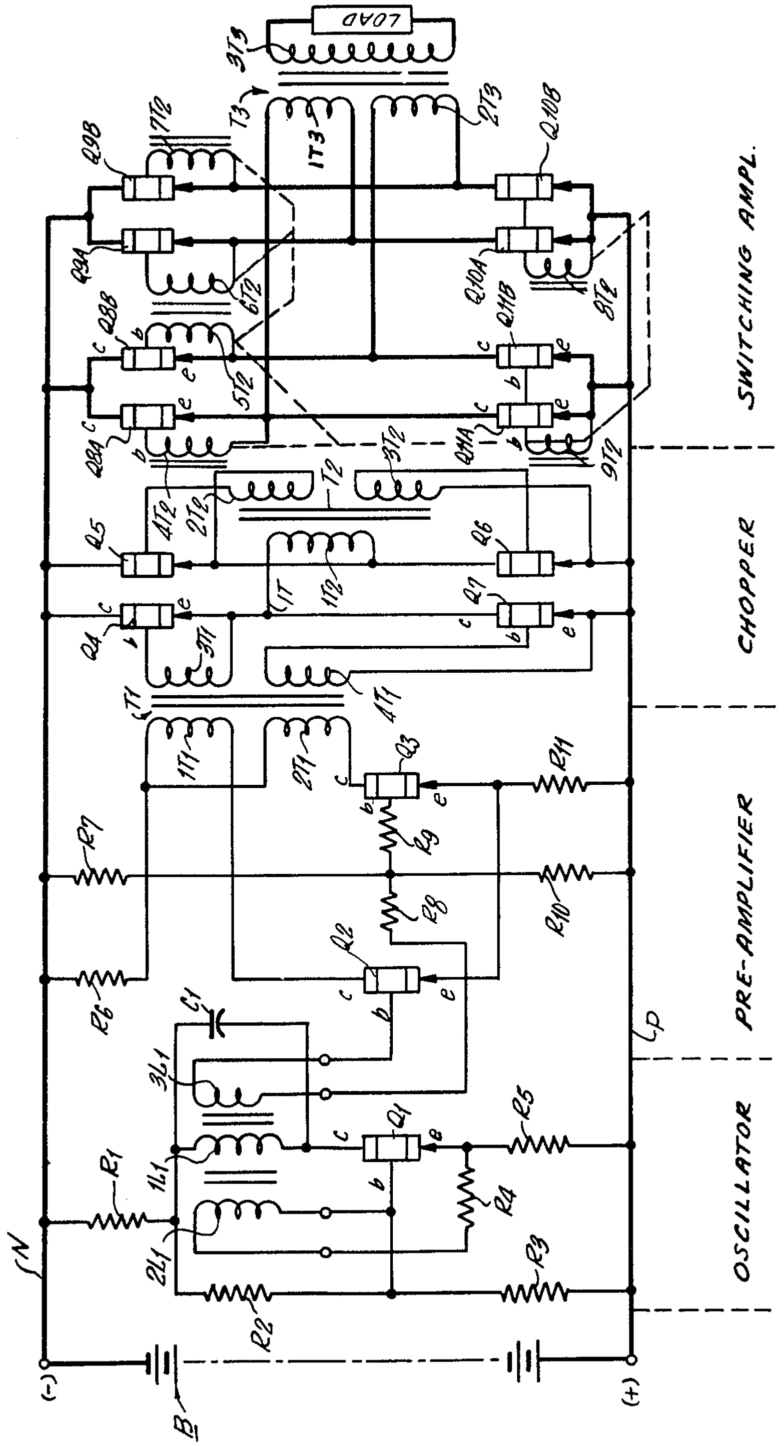
Figure 2:
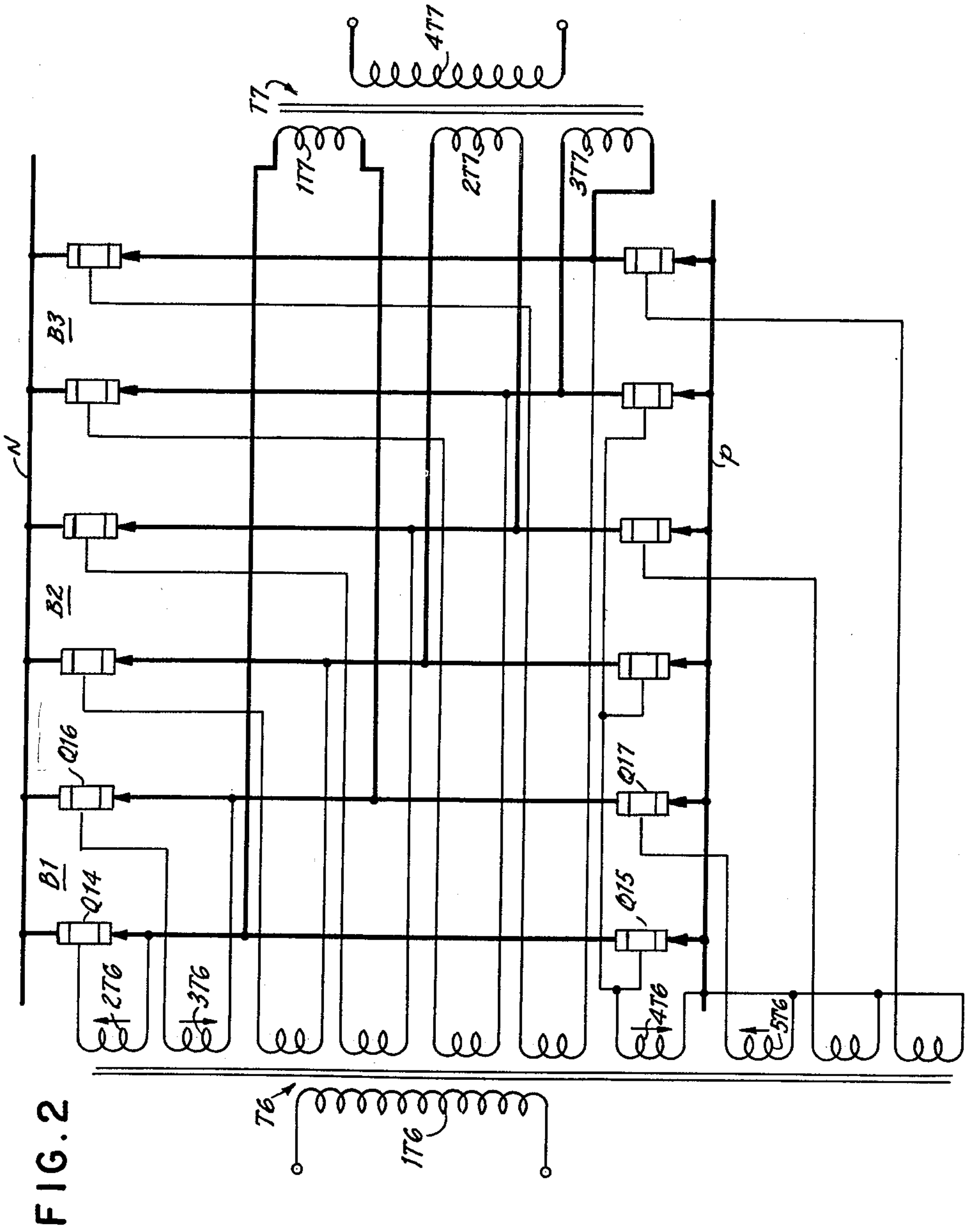

The foregoing and more specific objects and features of my invention will be explained with reference to the embodiments illustrated by way of example on the accompanying drawings, in which:

FIG. 1 is a schematic circuit diagram of an inverter which comprises a singe-phase system of two power-transistor bridge networks operating in parallel, and FIG. 2 is a circuit diagram of a transistor power amplifier comprising three transistor bridge networks in parallel.

The transistors shown in both figures consist preferably of junction-type transistors such as p-n-p germanium or silicon power transistors.

According to FIG. 1, a direct voltage to be translated into 60 c.p.s. alternating voltage is supplied from a source B through a negative bus N and a positive bus P. The voltage is impressed across a voltage divider formed by three resistors R1, R2, and R3 connected in series between buses N and P. The base *b* of a transistor Q1 is connected to a circuit point between resistors R2 and R3. The emitter *e* of transistor Q1 is connected to bus P through a resistor R5. The collector circuit of transistor Q1, extending from collector *c* to a circuit point between resistors R1 and R2, includes a tank circuit composed of a capacitor C1 and an inductance coil 1L1 whose core has a substantially linear characteristic and carries two secondary windings 2L1 and 3L1. Winding 2L1 is feedback-connected between the base *b* and emitter *e* of transistor Q1 through a resistor R4.

The substantially sinusoidal output voltage of the oscillator is supplied by winding 3L1 to the input terminals of a pre-amplifier network which is essentially a constant sum-current amplifier of the differential type. The input signal from winding 3L1 is applied to the base *b* of a transister Q2 and also, through a resistor R8, to the mid-point of a voltage divider formed by two resistors R7 and R10 connected in series between buses N and P. Another transistor Q3 has its base connected to the same mid-point through a resistor R9. The respective emitters *e* of transistors Q2 and Q3 are jointly connected through a resistor R11 to bus P. The collector circuits of transistors Q2 and Q3 include respective primary windings 1T1 and 2T1 of a coupling transformer T1 in series with a resistor R6. The output of the pre-amplifier appears at the secondary windings 3T1 and 4T1 of transformer T1. The signal provided by the secondary 3L1 of inductance coil 1L1 is sufficient to cause saturation of the pre-amplifier transistors Q2 and Q3. Therefore, the voltage of the secondary windings 3T1 and 4T1 of the driver output transformer T1 has a limited amplitude and hence has substantially sinusoidal flanks but a flattened top.

Two secondary windings 3T1, 4T1 of transformer T1 apply the pre-amplifier output signal to a chopper stage which comprises four bridge-connected transistors Q4, Q5, Q6, Q7 and furnishes an output signal representing a square wave. The secondary windings 3T1 and 4T1 of transformer T1 are connected in the respective base-emitter circuits of transistors Q4 and Q7.

The primary winding 1T2 of a coupling transformer T2 is connected in the bridge diagonal branch extending from a circuit point between transistors Q4 and Q7 to a corresponding point between transistors Q5 and Q6. The coupling transformer T2 has a total of eight secondary windings designated by 2T2 through 9T2. Only two of these windings, namely secondaries 2T2 and 3T2, are shown directly adjacent to the primary winding 1T2, whereas the others are shown at various other places for the purpose of lucid, straight-line illustration.

While transistors Q4 and Q7 are driven directly by voltages from the respective secondaries 3T1 and 4T1 of transformer T1, base-emitter circuits of transistors Q5 and Q6 are connected to the respective secondaries 2T2 and 3T2 of transformer T2, so that the latter two transistors driven by feedback voltages.

The transformer T2 supplies the square-wave signal to a power amplifier stage which is essentially a switching-transistor device and, in the illustrated embodiment, comprises a total of eight transistors, Q8A, Q8B, Q9A, Q9B, Q10A, Q10B, Q11A and Q11B. Transistors Q8A and Q11A are connected in series between buses N and P. Transistors Q9A and Q10A are similarly connected between the two buses. The transistors Q8B and Q11B form together a parallel circuit relative to transistors Q8A and Q11A; and transistors Q9B and Q10B are similarly connected paralled to transistors Q9A and Q10A. Each of these transistors receives a control signal from transformer T2 through one of the respective secondaries 4T2 through 9T2. Thus, each of the transistors Q8A through Q11B is driven by the above-mentioned output signal of the coupling amplifier.

The power output transformer T3 of the inverter system has two primaries 1T3 and 2T3 poled in the same sense. The primary 1T3 is connected to the lead between the emitter of transistor Q8A and the collector of transistor Q11A, on the one hand, and the lead between the emitter of transistor Q9A and the collector of transistor Q10A on the other hand. The primary winding 2T3 is similarly connected between a circuit point intermediate the transistors Q8B and Q11B on the one hand and a corresponding circuit point intermediate the transistors Q9B and Q10B on the other hand. The secondary winding 3T3 of the power output transformer T3 energizes the inverter load circuit.

The operation of the switching amplifier stage will be more readily understood if one first disregards the presence of the parallel transistors Q8B, Q11B, Q9B, Q10B and of the primary winding 2T3 to which these transistors are connected.

The transistors Q8A, Q9A, Q10A, Q11A, driven by the respective secondary windings of transformer T2, duplicate the input signal coming from the coupling amplifier. During a positive going pulse, the transistors Q8A and Q10A are turned "on," while transistors Q9A and Q11A are simultaneously turned "off." During the negative going pulse, transistors Q9A and Q11A are turned "on," while transistors Q8A and Q10A are turned "off." As a result, the signal is amplified and impressed upon the transformer winding 1T3, thus being transmitted to the load circuit.

The parallel connected transistors Q8B, Q9B, Q10B and Q11B operate in the same manner as the group of respective transistors Q8A through Q11A, except that they energize the second primary winding 2T3 which operates in the same sense as the winding 1T3 relative to the winding 3T3.

The provision of parallel transistors, described above, is suitable in cases where the output power requirements of the inverter system are relatively great. The proper load sharing of the parallel transistors is secured by splitting the primary winding of the power output transformer T3 into as many mutually insulated paths as there are paralleled groups of transistors. That is, if desired, more than one parallel path with respect to each transistor circuit may be provided, giving the output transformer T3 just as many primary windings as there are transistor parallel circuits. The respective primary windings are given equal winding resistances. With the transistors approaching ideal switching operation, any difference in the respective shares of the load current passing through the parallel transistor paths would tend to cause a greater IR drop in one of the primary windings relative to the other, but due to the mutual inductive coupling of the primary windings the system inherently counteracts such tendency with the result of imposing equal shares of load upon the paralleled transistors. Ideal conditions in this respect are obtained when the winding resistances of the transformer primaries are greater than the saturation resistance of the transistors.

The power amplifier illustrated in FIG. 2 comprises three individual bridge networks of power transistors operating in the switching mode, substantially as explained above with reference to FIG. 1.

The first amplifier bridge network B1 is composed of four transistors Q14 to Q17 each two of which are connected in series with each other between the positive bus P and the negative bus N of the direct-current supply. The control circuits of these four transistors receive driving voltages from respective secondaries 2T6, 3T6, 4T6 and 5T6 of an input signal transformer T6 whose primary winding 1T6 receives an alternating voltage, for example by such means as described with reference to FIG. 1.

The two other bridge networks of transistors, denoted by B2 and B3, are designed and controlled in an analogous manner. The output circuit of bridge B1 is connected to a primary 1T7 of an output transformer T7. The bridges B2 and B3 are similarly connected to respective primaries 2T7 and 3T7 of the same transformer, all three primaries operating at any moment in the same sense to provide the secondary winding 4T7 with single-phase amplified square-wave voltage. Due to the mutual inductive coupling between the windings 1T7, 2T7 and 3T7, which have all the same resistance of a value greater than the saturation resistance of the transistor networks, any tendency of non-uniform load sharing is counteracted with the result that the bridges B1, B2, B3 share the load in substantially equal proportions.

It will be obvious to those skilled in the art, upon a study of this disclosure, that my invention permits of various other modifications, and is applicable to the same advantage in conjunction with controllable semiconductor rectifiers and with semiconductor amplifier circuits other than of the bridge network type, without departing from the essential features of my invention and within the scope of the claims annexed hereto.

I claim:

1. In combination, direct-current supply buses a plurality of controllable semiconducting rectifier units having respective main circuits connected across said buses in parallel relation to each other and having respective controls circuits, signal input means connected with said control circuits of all said parallel connected semiconducting rectifier units for simultaneously controlling them in the same sense, an output transformer having a secondary circuit common to all said main circuits and having a number of mutually insulated and inductively interlinked primaries, and circuit means connecting each of said primaries to one of said respective main circuits for energization of said primaries by said buses under control by said units, said primaries being poled to produce simultaneous flux changes in the same sense, whereby said main circuits are constrained to share the load of said output transformer.

2. In combination, direct-current supply buses, a plurality of transistor amplifier circuits connected across said buses in parallel relation to each other and having respective control circuits, signal input means connected with said control circuits of all said parallel connected transistor circuits for simultaneously controlling them in the same sense, an output transformer having a secondary circuit common to all said transistor circuits and having a number of mutually insulated and inductively interlinked primaries, and circuit means connecting each of said primaries to one of said respective transistor circuits for energization of said primaries by said buses under control by said transistor circuits, primaries being poled to produce simultaneous flux changes in the same sense, whereby said parallel transistor circuits are constrained to share the load of said output transformer.

3. In combination, power supply buses, a plurality of transistors having respective collector-emitter circuits connected across said buses in parallel relation to each other, a signal input transformer having a primary signal circuit and having a number of mutually insulated secondaries, each of said parallel transistors having a base-emitter circuit connected to one of said respective secondaries to be energized in the same sense, an output transformer having a secondary output circuit and having a number of mutually insulated and inductively interlinked primaries poled in the same sense, and circuit means connecting each of said primaries to one of said respective collector-emitter circuits for energization of said primaries by said buses under control by said transistors, said primaries being poled to produce simultaneous flux changes in the same sense, whereby said parallel transistors are constrained to share the load of said output transformer substantially in a given proportion.

4. In combination, power supply buses, a plurality of switching transistors of the junction type having respective collector-emitter circuits connected across said buses in parallel relation to each other, a signal input transformer having a primary signal circuit and having a number of mutually insulated secondaries, each of said parallel transistors having a base-emitter circuit connected to one of said respective secondaries to be energized in the same sense, an output transformer having a secondary output circuit and having a number of mutually insulated and inductively interlinked primaries poled, all said primaries having the same number of turns and the same resistance, and circuit means connecting said primaries to respective ones of said collector-emitter circuits for energization of said primaries by said buses under control by said transistors, said winding resistance being greater than the saturation resistance of said switching transistors, said primaries being poled to produce simultaneous flux changes in the same sense, whereby said parallel transistors are constrained to equally share the load of said output transformer.

5. A transistor power amplifier, comprising two direct-current buses, a plurality of parallel-connected bridge networks each having four transistors forming a series loop with each other, a pair of electrically adjacent ones of said transistors in each bridge network having respective collectors connected to one of said buses, the other pair of transistors having respective emitters connected to said other bus, and each of said bridge networks having two loop points of which each is separated from said buses by two of said transistors respectively; a signal input transformer having a number of mutually insulated secondary windings, the two transistors of one of said pairs having respective base-emitter circuits of which each is individually connected to one of said respective windings, the other two transistors of each bridge network having respective base-emitter circuits connected to at least one other of said windings; and a power output transformer having a plurality of mutually insulated and inductively interlinked primaries each connected across said two loop points of one of said respective bridge networks, said primaries being poled to produce simultaneous flux changes in the same sense, whereby said parallel connected transistor networks are constrained to share the power load in a given proportion to each other.

6. A transistor power amplifier of the switching type, comprising two direct-current buses, a plurality of bridge networks connected in parallel to each other, each network having four junction-type transistors loop-connected with each other, a pair of electrically adjacent ones of said transistors in each bridge network having respective collectors connected to one of said buses, the other pair of transistors having respective emitters connected to said other bus, and each of said bridge networks having two loop points of which each is separated from said buses by two of said transistors respectively; a signal input transformer having a number of mutually insulated secondary windings, the two transistors of one of said pairs having respective base-emitter circuits connected to two of said windings respectively, said two windings being poled in voltage-opposed relation to each other so that a signal received by said input transformer turns one of said two latter transistors on while turning the other one off, the other two transistors of each bridge network having respective base-emitter circuits jointly connected to another one of said windings, and a power output transformer having a plurality of mutually insulated and inductively interlinked primaries each connected across said two loop points of one of said respective bridge networks, said primaries being poled to produce simultaneous flux changes in the same sense, whereby said parallel connected transistor networks are constrained to share the power load substantially in a given proportion to each other.

7. In a power amplifier according to claim 5, said four transistors having low saturation resistances, and said primary windings having among themselves substantially the same winding resistance, said winding resistance being greater than the saturation resistance of said switching transistors, whereby said parallel connected bridge networks share the load in substantially equal proportions.

References Cited by the Examiner

UNITED STATES PATENTS

| | | | |
|---|---|---|---|
| 2,547,162 | 4/51 | Kidd | 321—27 |
| 2,609,499 | 9/52 | Gilson | 328—28 |
| 2,821,639 | 1/58 | Bright | 332—52 |
| 2,849,612 | 8/58 | Royer et al. | 307—88.5 |
| 2,872,582 | 2/59 | Norton | 307—88.5 |
| 2,965,833 | 12/60 | Jensen | 307—88.5 |

OTHER REFERENCES

Reference I—Article in "Electronics," January 1946, page 117, Figure 13.

"Transistorized Three-Phase Power Supplies" by Brannian, Electronic Industries, January 1959, Figure 7 of that article.

ARTHUR GAUSS, *Primary Examiner.*

GEORGE N. WESTBY, JOHN W. HUCKERT, *Examiners.*